(12) United States Patent
Chitaka et al.

(10) Patent No.: US 9,578,761 B2
(45) Date of Patent: Feb. 21, 2017

(54) ELECTRONIC CONTROL UNIT AND PROTECTIVE CASE

(71) Applicant: DENSO CORPORATION, Kariya, Aichi-pref. (JP)

(72) Inventors: Hiroki Chitaka, Kariya (JP); Masaru Yokota, Kariya (JP); Mitsuteru Suzaki, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/892,075

(22) PCT Filed: May 16, 2014

(86) PCT No.: PCT/JP2014/002593
§ 371 (c)(1),
(2) Date: Nov. 18, 2015

(87) PCT Pub. No.: WO2014/188692
PCT Pub. Date: Nov. 27, 2014

(65) Prior Publication Data
US 2016/0120044 A1 Apr. 28, 2016

(30) Foreign Application Priority Data
May 22, 2013 (JP) ................................ 2013-108109

(51) Int. Cl.
*H05K 5/00* (2006.01)
*H05K 7/14* (2006.01)
*B60R 16/023* (2006.01)

(52) U.S. Cl.
CPC .............. *H05K 5/0047* (2013.01); *H05K 5/00* (2013.01); *H05K 5/0008* (2013.01);
(Continued)

(58) Field of Classification Search
None
See application file for complete search history.

(56) References Cited

U.S. PATENT DOCUMENTS

| 6,101,087 A * | 8/2000 | Sutton ................. B60R 11/0252 |
| | | 361/679.44 |
| 6,275,385 B1 * | 8/2001 | Sahara ................. H05K 7/1414 |
| | | 361/679.54 |
| 2014/0125472 A1* | 5/2014 | Konno ..................... B62M 7/02 |
| | | 340/427 |
| 2014/0144720 A1* | 5/2014 | Konno ..................... B62M 7/02 |
| | | 180/287 |

FOREIGN PATENT DOCUMENTS

| JP | S51026586 Y1 | 7/1976 |
| JP | 2000174468 A | 6/2000 |

(Continued)

OTHER PUBLICATIONS

International Search Report and Written Opinion (in Japanese with English Translation) for PCT/JP2014/002593, mailed Jul. 8, 2014; ISA/JP.

(Continued)

*Primary Examiner* — Courtney Smith
*Assistant Examiner* — Rashen E Morrison
(74) *Attorney, Agent, or Firm* — Harness, Dickey & Pierce, P.L.C.

(57) ABSTRACT

An electronic control unit includes a plate-shaped control board, a long pillar-shaped battery pack, a fixing frame that includes a juxtaposing and mounting part, to which the control board and the battery pack are fixed, and a housing that includes an opening portion and a back side holding portion to accommodate the control board and the battery pack. The juxtaposing and mounting part is inserted into the opening portion. The fixing frame is fixed to the opening portion. The back side holding portion holds the juxtaposing and mounting part at an inner back side of the housing opposed to the opening portion. The back side holding portion includes a protruding portion protruding toward the opening portion at a position away from a bottom surface of (Continued)

the housing on the inner back side of the housing. The juxtaposing and mounting part includes a tip portion in a direction of the insertion of the juxtaposing and mounting part into the housing. The tip portion has a curved shape that is urged from its upper side by a lower surface of the protruding portion and that is urged from its lower side by the bottom surface of the housing on the inner back side of the housing.

6 Claims, 12 Drawing Sheets

(52) U.S. Cl.
CPC ......... *H05K 5/0017* (2013.01); *H05K 5/0039* (2013.01); *H05K 7/14* (2013.01); *B60R 16/0239* (2013.01)

(56) References Cited

FOREIGN PATENT DOCUMENTS

| | | | |
|---|---|---|---|
| JP | 2000183542 A | 6/2000 | |
| JP | 2000244152 A | 9/2000 | |
| JP | 2000244153 A | 9/2000 | |
| JP | 2000261166 A | 9/2000 | |
| JP | 2006005083 A | 1/2006 | |
| JP | 2006086382 A | 3/2006 | |
| WO | WO-2012176299 A1 | 12/2012 | |

OTHER PUBLICATIONS

U.S. Appl. No. 14/892,083, filed Nov. 18, 2015, Chitaka et al.

\* cited by examiner

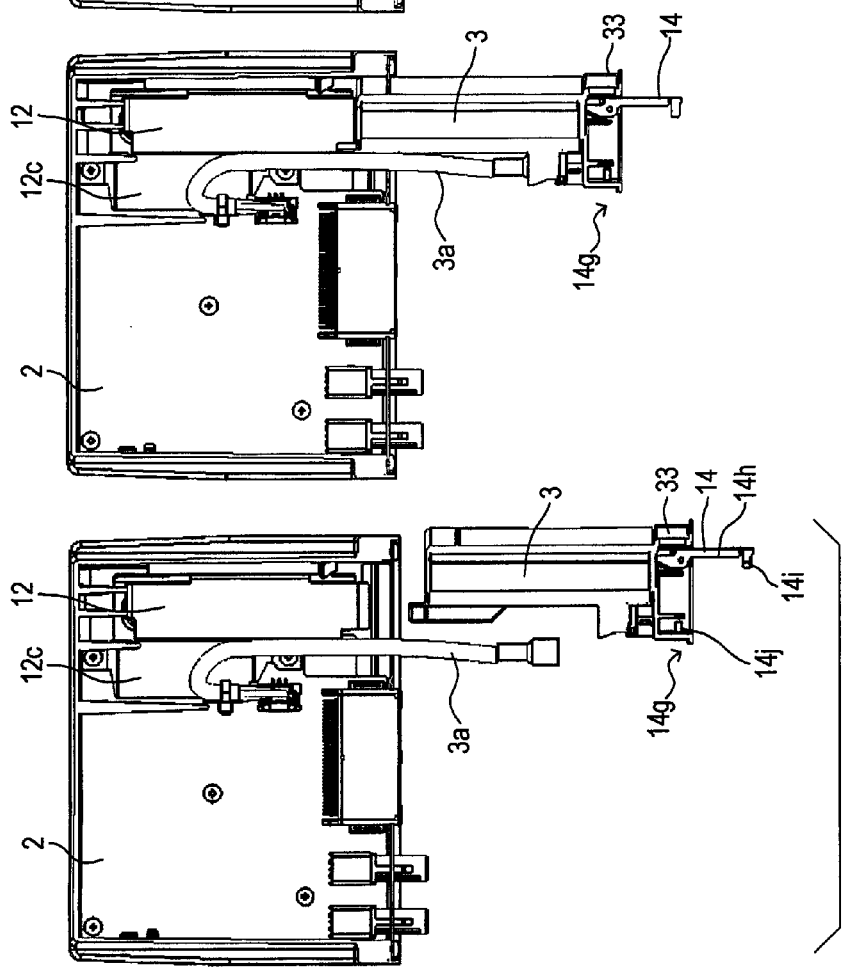

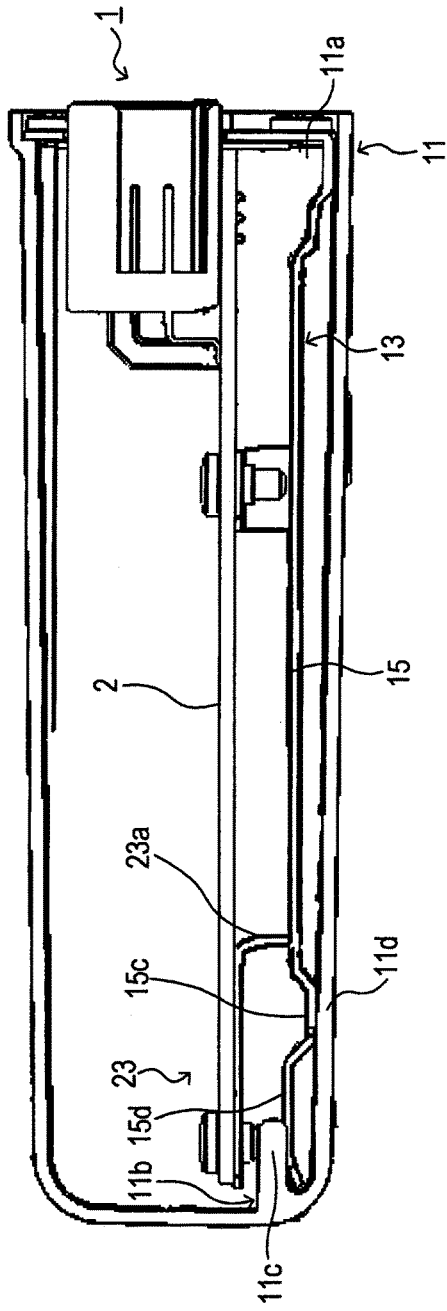
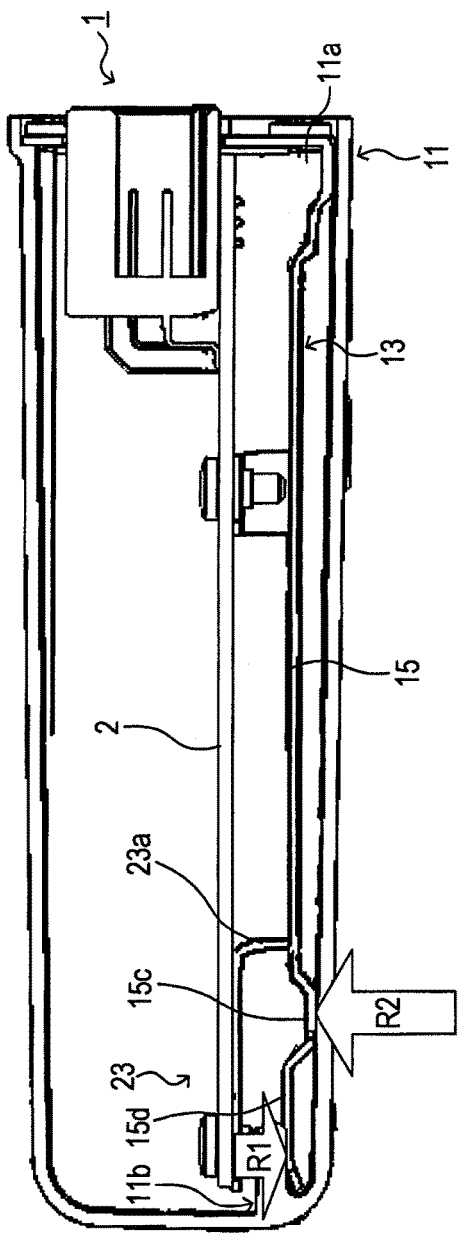
FIG. 9A
FIG. 9B

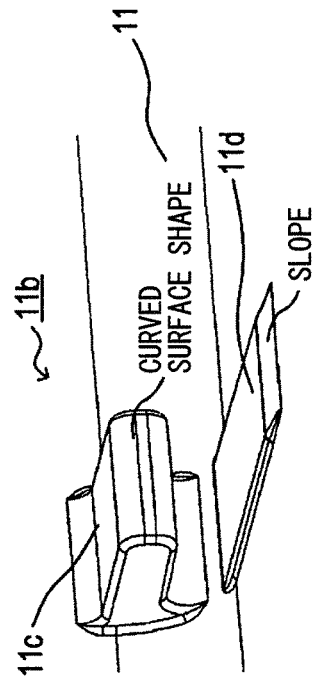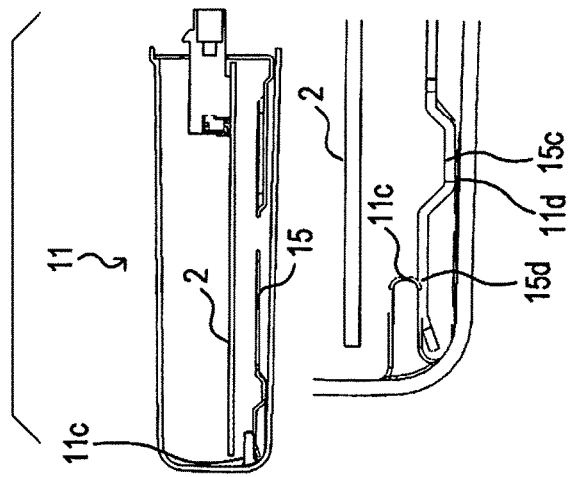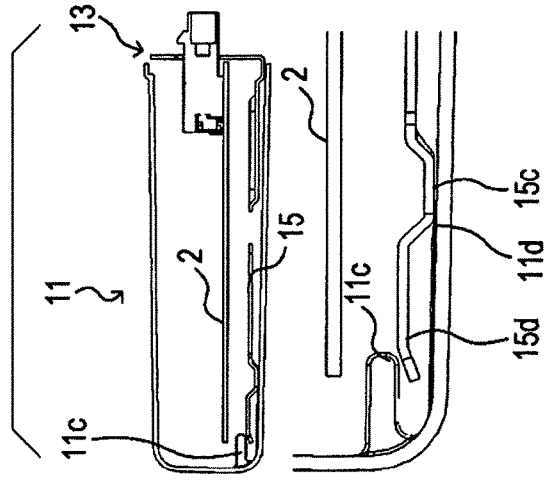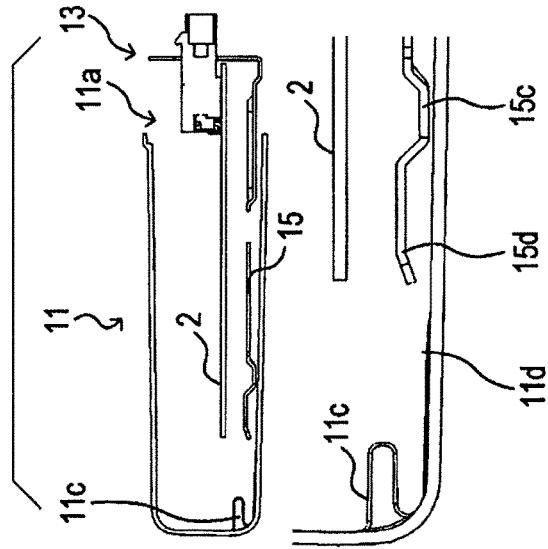

ELECTRONIC CONTROL UNIT AND PROTECTIVE CASE

CROSS REFERENCE TO RELATED APPLICATIONS

This application is a U.S. National Phase Application under 35 U.S.C. 371 of International Application No. PCT/JP2014/002593 filed on May 16, 2014 and published in Japanese as WO 2014/188692 A1 on Nov. 27, 2014. This application is based on and claims the benefit of priority from Japanese Patent Application No. 2013-108109 filed on May 22, 2013. The entire disclosures of all of the above applications are incorporated herein by reference.

TECHNICAL FIELD

The present disclosure relates to: an electronic control unit including a control board that has an electronic control circuit mounted with a plurality of electronic parts and that has a plate shape; and a protective case for protecting the control board.

BACKGROUND ART

Conventionally, as a protective case for protecting a control board from outside dust and dirt and rain drops has been generally used a case of the type in which: support rails are provided on the left and right peripheral walls of a housing for housing the control board; the control board is inserted into the housing along the support rails; and the housing is fixed with a cover (for example, see Patent Document 1).

Further, there has been considered a structure in which, in place of the support rails, a plurality of protruding parts (ribs) are formed on the peripheral wall of a housing alternately in a depth direction of the housing at a spacing corresponding to a designed thickness of the upper and lower surfaces of the control board, whereby even if the control board is formed in a thickness a little larger than a specified spacing of the protruding portion, the control board is bent and inserted along the ribs, thereby being surely fixed in the housing (for example, see Patent Document 2).

PRIOR ART DOCUMENTS

Patent Documents

Patent Document 1: JP2000-244152A
Patent Document 2: JP2000-244153A

By the way, in recent years has been developed, for example, an electronic control unit called an eCall unit that automatically transmits information relating to the operation of an air bag when a vehicle accident is caused or the sensing information of a crash sensor, a GPS receiver, and the like to a specified center. The electronic control unit like this shall have a backup battery (BUB) that can always supply the electronic control circuit with an electric power so as to be able to respond even in case of emergency such that the supply of the electric power from a vehicle-mounted battery is stopped.

For this reason, in this kind of electronic control device, not only the control board but also the BUB needs to be protected, so it is thought to be desirable that not only the control board but also the BUB (in more detail, a battery pack in which the BUB is housed) can be protected by a protective case.

However, a conventional protective case employs a structure in which the control board is fixed to the housing by a support rail (or rib). Hence, as shown in FIG. 11A, when a structure is employed in which a control board 102 is fixed only by one support rail (or rib) of support rails (ribs) on the left and right peripheral walls of a housing 101 so as to house the control board 102 and the battery pack 103 side by side in the housing 101, the control board 102 cannot be stably supported in the housing 101. In this way, when the control board 102 is greatly swung by vibration and impact in a vehicle, the electronic control circuit is likely to be erroneously operated or damaged.

Further, as shown in FIG. 11B, when a battery case for housing a battery pack 203 is provided integrally with an upper portion of a housing 201, a protective case results in the shape of a letter L as the whole. Hence, in the case where the protective case is mounted in a vehicle, in view of balance in arrangement between the protective case and the other device and members, a vacant pace in an upper portion of the housing 201 is easily to be a dead space. For this reason, when an electronic control unit is mounted in a limited space in the vehicle, it is concerned that a whole layout is made complicated.

Still further, when a battery case is mounted separately from the housing and the housing and the battery case are arranged side by side, it is concerned that the number of parts is increased to thereby increase a manufacturing cost and a management cost. In contrast to this, as shown in 11(c), in the case where a partition wall part 304 for partitioning a space in which a control board 302 is arranged and a space in which a battery pack 303 is arranged is provided in a housing 301 and also a wall part 304 has a support rail to thereby hold the supporting strength of the control board 302, when a protective case is manufactured by the use of a mold, the wall part 304 needs to have a gradient for removing the mold and hence the protective case is increased in a width size, which hence causes such a concern that the electronic control unit (device) will be increased in size.

For the purpose of eliminating the concern, the present applicant has invented a unit that has a frame (fixing frame) in which a control board and a battery pack are fixed in a state of being arranged side by side and that has a mechanism for holding the fixing frame on an inner back side of the housing and that fixes the fixing frame by an opening portion of the housing to thereby support the fixing frame from both sides opposite to each other in the housing.

However, as shown in FIG. 12, in a construction in which a sandwiching part for sandwiching a part (protruding part) protruding on an inner back side of a housing 401 is provided, for example, in the case where an external force to a bottom surface side of the housing 401 is applied to the sandwiching portion (tip portion of the fixing frame), for example, by vibrations of a vehicle, a fixing frame 403 is bent in the direction of the bottom surface of the housing 401, whereby it can be thought that the control board 402 mounted on the sandwiching portion is also bent in the same direction. In other words, there is caused a problem that the control board 402 is bent to thereby increase the possibility that strain will be caused on the surface of the control board 402 (see S in FIG. 12).

SUMMARY OF INVENTION

The present disclosure addresses the above issues. Thus, it is an objective of the present disclosure to suitably restrain a control board from being bent in an electronic control unit and a protective case capable of securing supporting strength of the control board in a housing and avoiding a layout relating to setting parts from being complicated and, in addition, contributing to miniaturizing a device.

To achieve the objective of the present disclosure, an electronic control unit in an aspect of the present disclosure includes a plate-shaped control board that includes an electronic control circuit mounted with electronic parts, a long pillar-shaped battery pack that receives a backup battery (BUB) capable of constantly supplying electric power to the electronic control circuit, a fixing frame that includes a juxtaposing and mounting part on which the control board and the battery pack are mounted in a state of being adjacent to each other with a boundary line along a longitudinal direction of the battery pack therebetween, the control board and the battery pack being fixed to the juxtaposing and mounting part, and a housing that includes an opening portion and a back side holding portion to accommodate the control board and the battery pack. The juxtaposing and mounting part of the fixing frame is inserted into the opening portion. The fixing frame is fixed to the opening portion. The back side holding portion holds the juxtaposing and mounting part at an inner back side of the housing opposed to the opening portion.

In such a configuration of the present disclosure, the back side holding portion of the housing includes a protruding portion protruding toward the opening portion at a position away from a bottom surface of the housing on the inner back side of the housing. The juxtaposing and mounting part of the fixing frame includes a tip portion in a direction of the insertion of the juxtaposing and mounting part into the housing. The tip portion has a curved shape that is urged from its upper side by a lower surface of the protruding portion and that is urged from its lower side by the bottom surface of the housing on the inner back side of the housing.

In this construction, first, in the case where the fixing frame is housed in the housing in the state where the control board and the battery pack are fixed to the juxtaposing and mounting part, the back side holding portion of the housing is made to hold the fixing frame and the opening portion of the housing is made to fix the fixing frame, whereby the fixing frame can be supported by both sides opposite to each other in the housing and hence the supporting strength of the control board in the housing can be kept.

Next, the fixing frame has the control board and the battery pack fixed thereto adjacently to each other in a state of being arranged side by side. Hence, for example, the housing can be formed in a rectangular shape, which hence eliminates the need for providing a dead space around the housing. Further, this can eliminate also the need for providing a wall portion for partitioning a space in which the control board is arranged and a space in which the battery pack is arranged in the housing.

In the present disclosure, on the basis of the construction like this, the tip portion of the juxtaposing and mounting part of the fixing frame is formed in the curved shape by which the tip portion is biased by the lower surface of the protruding portion in the back side holding portion of the housing and by the bottom surface of the housing. Hence, when the back side of the housing is made to hold the tip portion of the juxtaposing and mounting part of the fixing frame, it is easy to design the tip portion in such a way as to absorb a part size error of the tip portion and the protruding portion in the back side holding portion of the housing. In this way, it is possible to make the back side of the housing hold the tip portion of the juxtaposing and mounting part of the fixing frame.

The tip portion of the juxtaposing and mounting part of the fixing frame (tip portion in the direction of the insertion of the juxtaposing and mounting part into the housing) includes a tip protruding portion that is urged from its upper side by the lower surface of the protruding portion, and a bottom surface portion that is urged from its lower side by the bottom surface of the housing. Even in the case where the external force to the bottom surface side of the housing is applied to the tip protruding portion of the fixing frame, by a reaction force that the bottom surface portion of the fixing frame receives from the bottom surface of the housing, it is possible to restrain the fixing frame from being bent.

Hence according to the present disclosure, in the electronic control unit that secures the supporting strength of the control board in the housing and that avoids a layout relating to a device from being complicated and that can contribute to miniaturizing the device, it is possible to suitably restrain the fixing frame from being bent and hence to suitably restrain the control board fixed to the fixing frame from being bent.

In the present disclosure, the juxtaposing and mounting part of the fixing frame may include a flange that clamps the protruding portion of the back side holding portion of the housing together with the tip protruding portion, with the control board mounted on the flange. In this case, even in the case where the external force to the bottom surface side of the housing is applied to the flange, by a reaction force that the bottom surface portion of the fixing frame receives from the bottom surface of the housing, it is possible to restrain the fixing frame from being bent. Hence, the tip protruding portion of the fixing frame sandwiches the protruding portion in the back side holding portion of the housing, which hence can strongly hold the fixing frame in the housing and can suitably restrain the control board from being bent.

In the present disclosure, the juxtaposing and mounting part of the fixing frame may include a bottom surface portion that is formed by drawing a main body of the fixing frame. In this case, the tip portion of the juxtaposing and mounting part of the fixing frame can be provided with a portion biased from below by the bottom surface of the housing, without adding and joining a new member, which hence can reduce the weight of the fixing frame and can facilitate the manufacturing of the fixing frame.

In the present disclosure, a tip portion of the protruding portion of the back side holding portion of the housing may have a curved surface shape for guiding the tip protruding portion of the fixing frame to the inner back side of the housing.

In this case, even if a distance (size) from an upper surface of the tip protruding portion of the fixing frame to a lower surface of a bottom surface portion is larger than a distance (size) from a lower surface of the protruding portion of the back side holding portion of the housing to a bottom surface of the housing, for example, by as large a magnitude as a part size error, the tip protruding portion of the fixing frame can be easily inserted to the inner back side of the housing. Hence, the tip portion of the fixing frame can be more strongly biased by the back side holding portion of the housing. In this way, the tip portion of the fixing frame can be suitably held by the back side holding portion of the housing.

Furthermore, in such a configuration, the back side holding portion of the housing may include a guide portion having a slope for gradually pushing up the bottom surface portion of the fixing frame when the tip protruding portion of the fixing frame is guided to the inner back side of the housing by the tip portion of the protruding portion. In this case, the tip portion of the fixing frame can be more strongly biased by the back side holding portion of the housing, whereby the tip portion of the fixing frame can be more suitably held by the back side holding portion of the housing.

In this regard, according to the present disclosure, the protective case including the housing, the battery holder, and the fixing frame, which are described above, can be circulated in the market. In this case, the protective case constructs the electronic control unit with the control board and the battery pack. Hence, it is possible to produce the same effect as the effect described above in the protective case.

BRIEF DESCRIPTION OF DRAWINGS

The above and other objects, features and advantages of the present disclosure will become more apparent from the following detailed description made with reference to the accompanying drawings. In the drawings:

FIG. 5A is a top view to show an example in which a battery pack is housed in a protective case in the embodiment;

FIG. 5B is a top view to show an example in which the battery pack is housed in the protective case in the embodiment;

FIG. 5C is a top view to show an example in which the battery pack is housed in the protective case in the embodiment;

FIG. 9A is an illustration to exemplify a construction of a back side holding portion of a housing and an interior of the housing in the embodiment;

FIG. 9B is an illustration to exemplify a construction of the back side holding portion of the housing and the interior of the housing in the embodiment;

FIG. 10A is an illustration to exemplify a construction of a back side holding portion of a housing and an interior of the housing in the embodiment;

FIG. 10B is an illustration to exemplify a construction of the back side holding portion of the housing and the interior of the housing in the embodiment;

FIG. 10C is an illustration to exemplify a construction of the back side holding portion of the housing and the interior of the housing in the embodiment;

FIG. 10D is an illustration to exemplify a construction of the back side holding portion of the housing and the interior of the housing in the embodiment;

EMBODIMENTS FOR CARRYING OUT INVENTION

Hereinafter, an electronic control unit as an embodiment will be described with reference to the drawings. Here, the electronic control unit of the present embodiment is constructed as an eCall unit that is set in a dashboard of a vehicle and that has a function of automatically transmitting information relating to the operation of an air bag when a vehicle accident is caused and the sensing information of a crash sensor, a GPC receiver or the like to a specified center by a radio transmission. Further, the electronic control unit of the present embodiment is set along with the other device and member in the dashboard of the vehicle and is set, in particular, under the duct of an air conditioner and hence needs to be operated without any problem even if the electronic control unit receives water drops leaking from the duct. Further, it is stipulated by law that the electronic control unit shall not cause any problem in the operation of the unit even if water drops fall on the unit.

Figure 1:
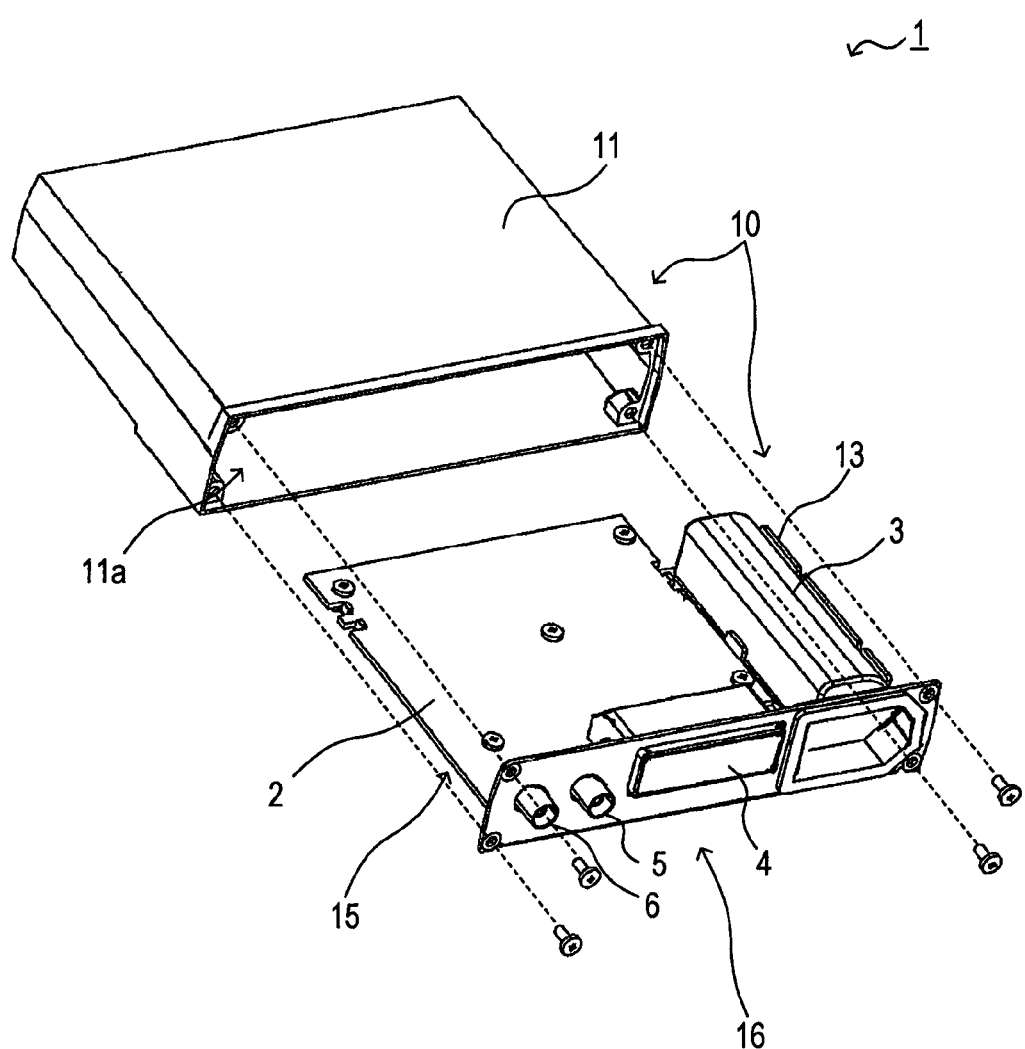
FIG. 1 is an exploded view, in perspective, to exemplify a general construction of an electronic control unit in an embodiment.

A general construction of an electronic control unit 1 of the present embodiment will be described. As shown in FIG. 1, the electronic control unit 1 is constructed of: a control board 2 having a plate shape; a battery pack 3 having a long cylindrical shape; and a protective case 10 that protects the control board 2 and the battery pack 3 from outside dust and dirt, water drops (in particular, water drops leaking from the duct of the air conditioner), and the like.

The control board 2 is a board to construct an electronic control circuit (not shown in the drawing) mounted with a plurality of electronic parts and has a plurality of connectors 4 to 6 connected to the electronic control circuit. In this regard, the electronic control circuit of the present embodiment has a microcomputer (not shown in the drawing) to perform a processing of realizing a function as the eCell unit. The microcomputer transmits radio signals, which show various kinds of information produced on the basis of the various kinds of signals inputted via at least one of the connectors 4 to 6, to an outside center via at least one of the connectors 4 to 6 by the radio communication.

In the present embodiment, a comparatively large rectangular connector 4 is a main connector and is connected to, for example, a device (air bag device) to expand an air bag, a crash sensor, or the like, and is used for acquiring information relating to the operation of the air bag (for example, whether or not the air bag is expanded) and the sensing information of the crash sensor (for example, an acceleration to show an impact applied to the vehicle). Further, of the comparatively small cylindrical connectors 5, 6, the connector 5 is connected to, for example, the GPS receiver and is used for acquiring the sensing information of the GPS receiver (for example, the present position of the vehicle), and the connector 6 is connected to a device (radio communication device) to make a radio communication to the outside center via a base station of a mobile phone network and is used for transmitting various kinds of information acquired via the connectors 4, 5 to the outside center by the radio communication.

The battery pack 3 is a part that receives a backup battery (BUB) capable of always supplying the electronic control circuit on the control board 2 with an electric power and that is shaped like a cylinder. Here, the BUB (not shown in the drawing) may be a battery to supply the electronic control circuit with the electric power under any circumstances or may be a battery that is supplied and charged with the electric power from a vehicle-mounted battery when an engine of the vehicle is operated and that can continuously supply the electronic control circuit with the electric power for a specified time from when the engine of the vehicle is stopped or from when the supply of the electric power from the vehicle-mounted battery is stopped. In this regard, the BUB (not shown in the drawing) is a battery that is supposed to be included by the electronic control unit 1 in such a way as to be able to always supply the electronic control circuit with the electric power even in the event of an emergency, for example, when the supply of the electric power from the vehicle-mounted battery is stopped (in other words, for the purpose of transmitting various kinds of information acquired via the connectors 3, 4 to the outside center by the radio communication).

Figure 8A:
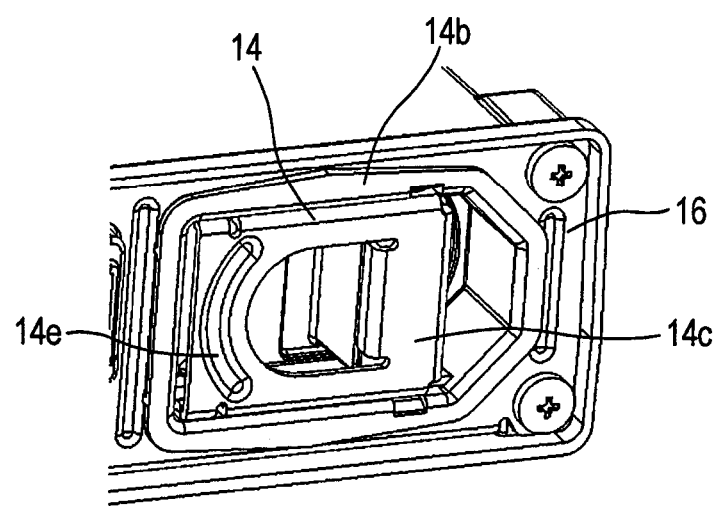
FIG. 8A is a front view to exemplify a construction of a battery fixture in the embodiment.
Figure 8B:
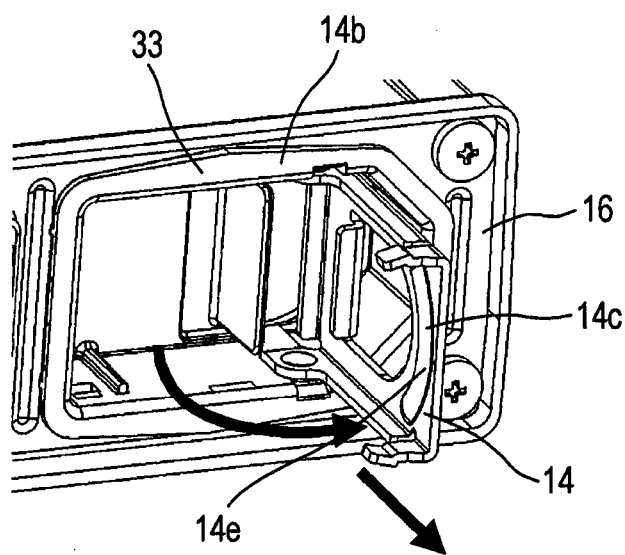
FIG. 8B is a front view to exemplify the construction of the battery fixture in the embodiment.
Figure 11B:
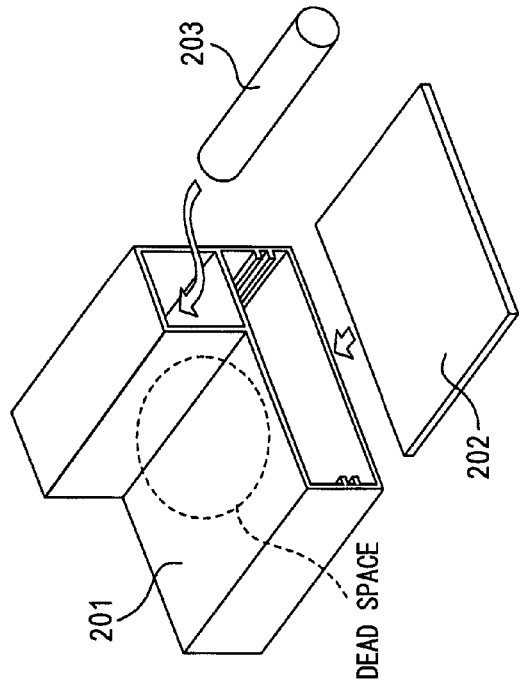
FIG. 11B is an illustration to show a prior art.
Figure 11A:
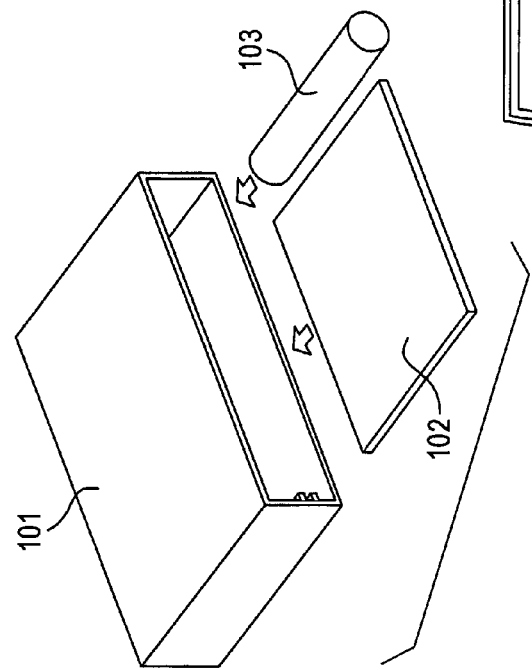
FIG. 11A is an illustration to show a prior art.
Figure 11C:
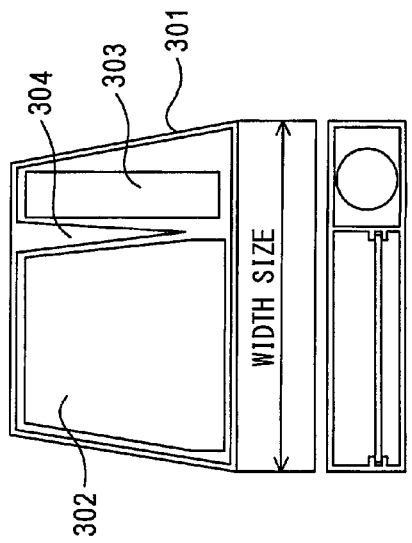
FIG. 11C is an illustration to show a prior art.
Figure 12:
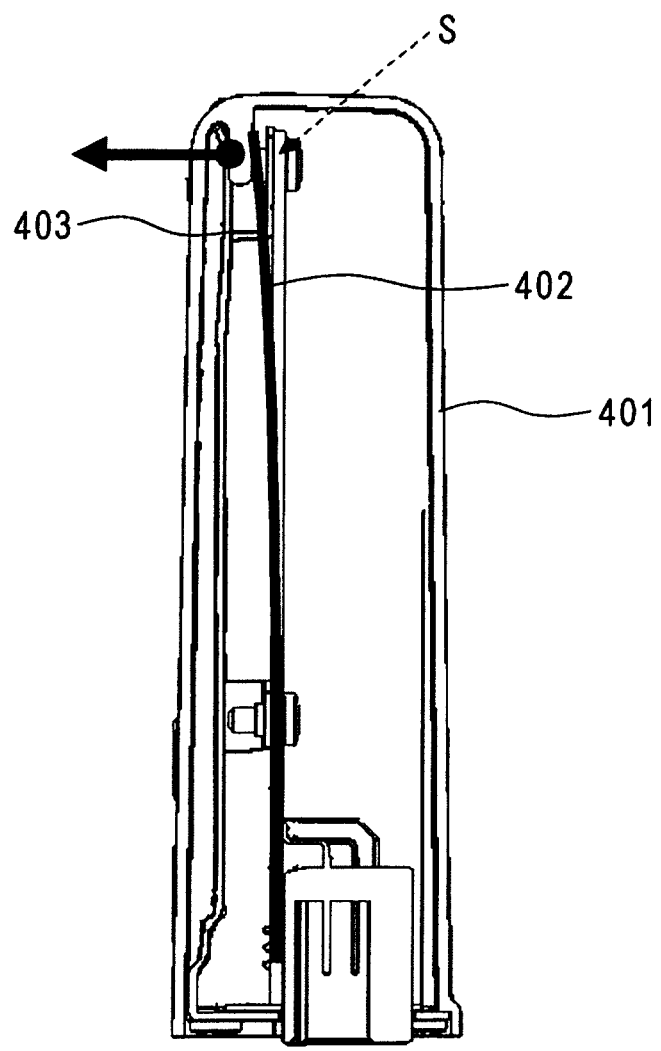
FIG. 12 is an illustration to show a prior art.

The protective case 10 is constructed of: a housing 11 to house the control board 2 and the battery pack 3; a battery holder 12 to hold the main body of the battery pack 3 (see FIGS. 3A and 3B); a fixing frame 13 to which the control board 2 and the battery holder 12 are fixed; and a battery fixture 14 fixed to a tip portion of the battery pack 3 (see FIGS. 5A to 5C; FIGS. 8A and 8B).

The main body of the battery pack 3 is held by the battery holder 12 (see FIGS. 3A and 3B), and the fixing frame 13 is fixed to the housing 11 with screws or the like in the state where the battery holder 12 (and the battery fixture 14) and the control board 2 are held by the fixing frame 13, whereby the control board 2 and the battery holder 12 can be housed in the protective case 10 in the state of being held watertight.

The construction of parts of the protective case 10 will be described. The housing 11 is made by pressing or the like and is formed in the shape of a box having an opening portion 11a into which a juxtaposing and mounting part 15 (which will be described later) of the fixing frame 13 is inserted. The opening portion 11a has screw holes formed at its four corners to which a sealing front part 16 (which will be described later) of the fixing frame 13 is connected with screws or the like.

Figure 2B:
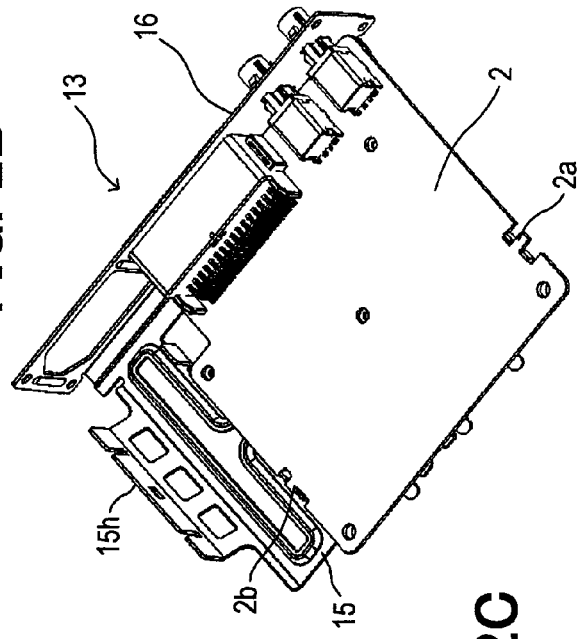
FIG. 2B is a perspective view to mainly exemplify a construction of a fixing frame in the embodiment.
Figure 2A:
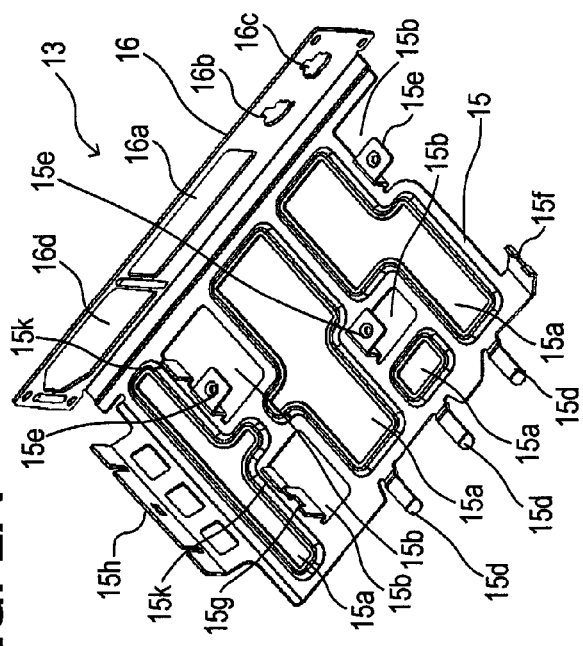
FIG. 2A is a perspective view to mainly exemplify a construction of a fixing frame in the embodiment.
Figure 2C:
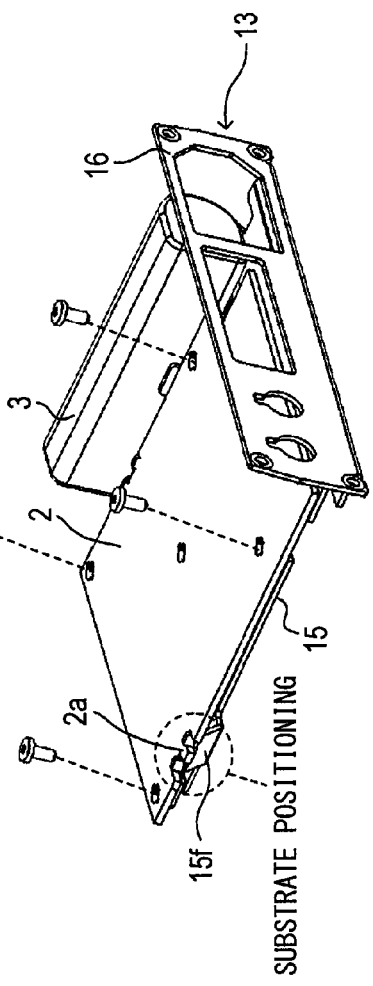
FIG. 2C is a perspective view to mainly exemplify a construction of a fixing frame in the embodiment.

The fixing frame 13 is made by a metal mold casting method such as die casting and, as shown in FIGS. 2A to 2C, is constructed of the juxtaposing and mounting part 15 and the sealing front part 16. The juxtaposing and mounting part 15 has a plate surface of the control board 2 and the battery pack 3 (to be exact, a bottom surface of the battery holder 12 (see FIGS. 3A and 3B)) mounted in the state of being adjacent to each other at a boundary along a longitudinal direction of the battery pack 3. The sealing front part 16 closes the opening portion 11a in the state where the juxtaposing and mounting part 15 is housed in the housing 11 (see FIG. 1) and is fixed to the housing 11 in the state of closing the opening portion 11a.

In the juxtaposing and mounting part 15, as shown in FIG. 2A, a bottom surface of the main body of the fixing frame 13 includes: a plurality of bottom surface protruding portions 15a formed by embossing a rear face by drawing; and a plurality of bottom surface opening portions 15b, and a bottom surface portion 15c other than the bottom surface protruding portions 15a and the bottom surface opening portions 15b is so constructed as to abut on an inner bottom surface of the housing 11.

Further, as shown in FIG. 2A, in the juxtaposing and mounting part 15, in order to fix a part of the control board 2 and the battery holder 12 (see FIGS. 3A and 3B), some of the bottom surface opening portions 15b have a plurality of erect face portions 15e formed at edge portions thereof, each of the erect face portion 15 being erected upward and having the plate surface of the control board 2 placed thereon. Each of the erect face portion 15e is erected at a height to make a clearance between the bottom surface of the control board 2 and a tip protruding portion 15d (upper surface) of the juxtaposing and mounting part 15 and has a screw hole formed therein, the screw hole being used to connect the control board 2 to the erect face portion 15e with a screw or the like.

Further, as shown in FIG. 2A, in the juxtaposing and mounting part 15, in order to position the control board 2, an end portion positioned on a side opposite to an area in which the battery pack 3 (to be exact, the bottom surface of the battery holder 12 (see FIGS. 3A and 3B)) is mounted (hereinafter referred to as "a battery mounting area") has a first positioning portion 15f formed thereon, the first positioning portion 15f being erected obliquely upward and being fitted in a first clipped portion 2a (see FIG. 2B) previously formed at the edge of the control board 2. The first positioning portion 15f, as shown in FIG. 2C, is erected at an angle in which the screw holes of the erect face portions 15e match the screw holes of the control board 2. Further, in the juxtaposing and mounting part 15, the bottom surface opening portion 15b adjacent to the battery mounting area has a second positioning portion 15g erected thereon, the second positioning portion 15g having a second clipped portion 2b (see FIG. 2B) formed on a side opposite to an edge in which the first clipped portion 2a is positioned in the control board 2.

Further, as shown in FIG. 2A, in the juxtaposing and mounting part 15, in order to position the battery holder 12 (see FIGS. 3A and 3B), an end portion positioned on a side opposite to an area in which the control board 2 is mounted (hereinafter referred to as "a board mounting area") has a joint portion 15h formed thereon, the joint portion 15h being erected along the shape of the battery holder 12 and being joined to a side surface of the battery holder 12.

Figure 3A:
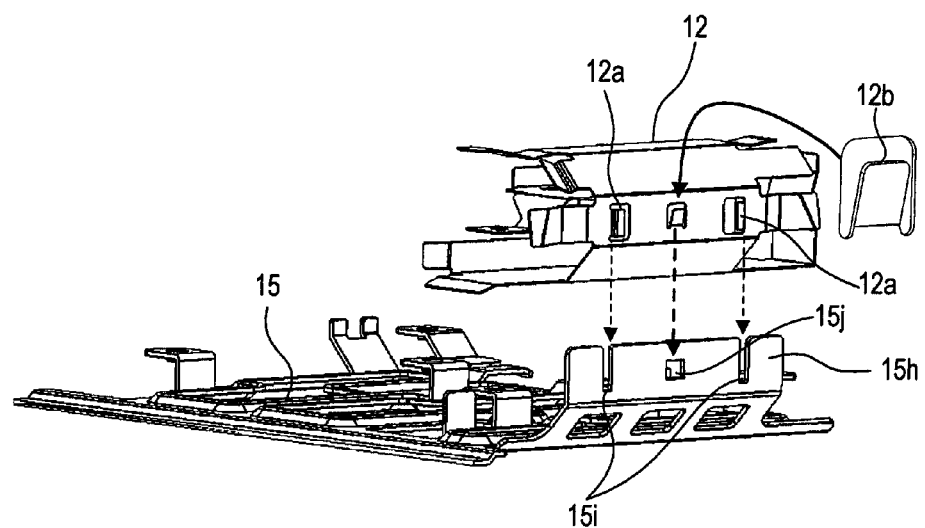
FIG. 3A is an illustration to show an example in which a battery holder is not yet fixed to a juxtaposing and mounting part of a fixing frame in the embodiment.
Figure 3B:
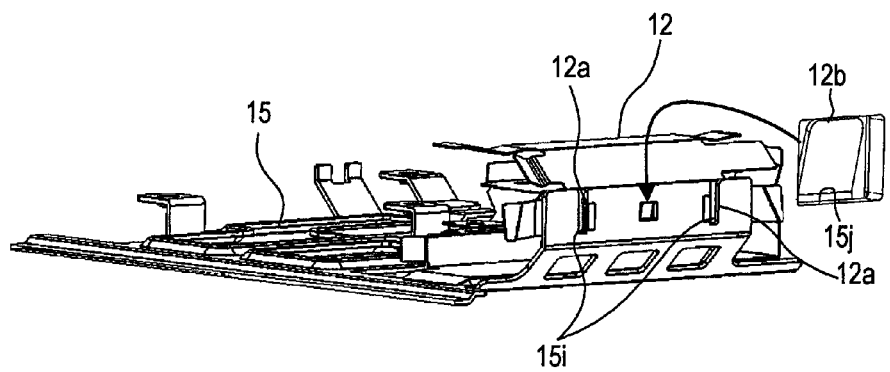
FIG. 3B is an illustration to show an example in which the battery holder is fixed to the juxtaposing and mounting part of the fixing frame in the embodiment.

Specifically, as shown in FIG. 3A, the battery holder 12 is bent in such a way that a face on the side on which the joint portion 15h of the juxtaposing and mounting part 15 abuts is formed in a shape having a plurality of faces. Further, of the plurality of faces on which the joint portion 15h of the juxtaposing and mounting part 15 abuts, a face vertical to the bottom surface has two longitudinally divided portions 12a and an erect portion 12b formed thereon, the longitudinally divided portions 12a protruding outward, the erect portion 12b being erected obliquely upward. The joint portion 15h of the juxtaposing and mounting part 15 has two slits 15i and a window portion 15j formed therein, the slits 15i having the longitudinally divided portions 12a of the battery holder 12 fitted therein, the window portion 15j having the erect portion 12b of the battery holder 12 fitted therein. In other words, as shown in FIG. 3B, when the battery holder 12 is pressed in the juxtaposing and mounting part 15 in such a way that the longitudinally divided portions 12a of the battery holder 12 are fitted in the slits 15i of the juxtaposing and mounting part 15, the erect portion 12b of the battery holder 12 is engaged with the window portion 15j of the juxtaposing and mounting part 15, whereby the battery holder 12 is locked in such a way as not to be removed from the juxtaposing and mounting part 15 (fixing frame 13). In this regard, the longitudinally divided portions 12a of the battery holder 12 can be bent along the side face of the joint portion 15h of the juxtaposing and mounting part 15 in the state where the erect portion 12b of the battery holder 12 is engaged with the window portion 15j of the juxtaposing and mounting part 15.

Further, as shown in FIG. 2A, an edge portion of the bottom surface opening portion 15b positioned along the boundary between the board mounting area and the battery mounting area in the juxtaposing and mounting part 15 has the erect face portions 15e and a plurality of (two, in the present embodiment) erect portions 15k formed thereon, the erect face portions 15e supporting a part of the control board 2 and the battery holder 12, the erect portions 15k being abutted on the side face (face A) of the battery holder 12.

Figure 4A:
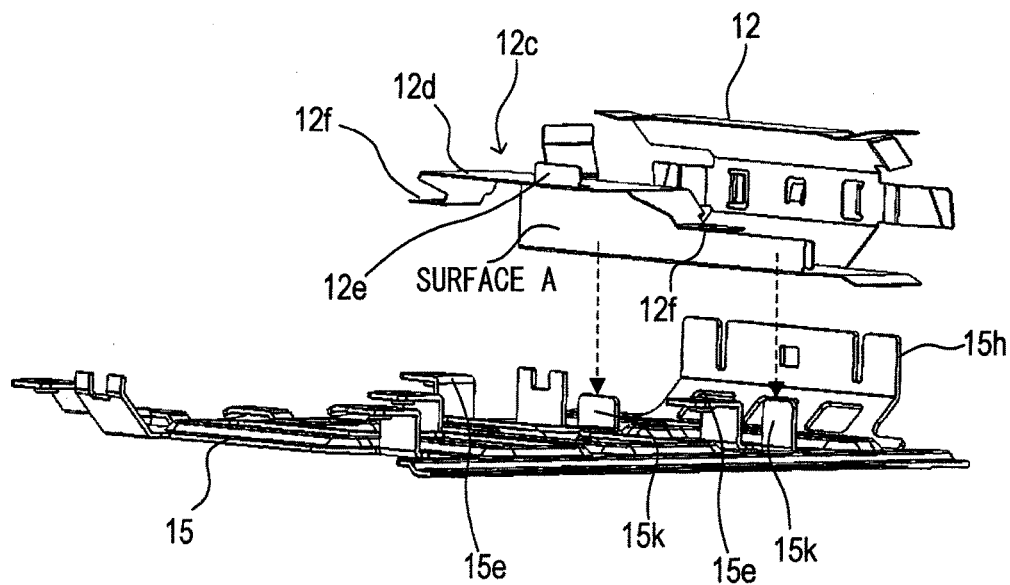
FIG. 4A is an illustration to show an example in which a battery holder is not yet fixed to a juxtaposing and mounting part of a fixing frame in the embodiment.
Figure 4B:
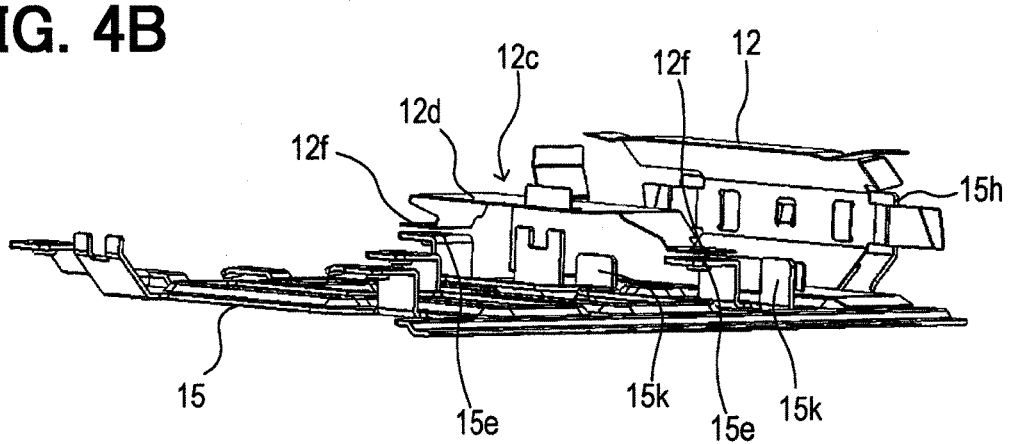
FIG. 4B is an illustration to show an example in which the battery holder is fixed to the juxtaposing and mounting part of the fixing frame in the embodiment.

Specifically, as shown in FIG. 4A, the battery bolder 12 has a wire mounting portion 12c in which a wire 3a (see FIGS. 5A to 5C) to connect the electronic control circuit on the control board 2 (see FIGS. 2A to 2C) to the BUB in the battery pack 3 (see FIGS. 3A and 3B) is mounted. The wire mounting portion 12c is bent to have a parallel face 12d, a restraining portion 12e, and mounting faces 12f. The parallel face 12d protrudes to a board mounting area side of the juxtaposing and mounting part 15. The restraining portion 12e is erected at an edge of the parallel face 12d so as to restrain the wire 3a from moving to the board mounting area side. The mounting faces 12f are extended obliquely downward from both ends of the parallel face 12d and are mounted on the erect face portions 15e of the juxtaposing and mounting part 15. The erect face portions 15e of the juxtaposing and mounting part 15 are formed at positions to support the mounting faces 12f of the wire mounting portion 12c from below so as to hold the parallel face 12d of the wire mounting portion 12c above the board mounting area in the juxtaposing and mounting part 15. Further, the erect portions 15k of the juxtaposing and mounting part 15 are formed at positions abutting on the side face (face A) of the battery holder 12 in such a way that the battery holder 12 does not move to the board mounting area side in the juxtaposing and mounting part 15. In short, as shown in FIG. 5B, when the battery holder 12 is joined to the joint portion 15h of the juxtaposing and mounting part 15, the side face (face A) of the battery holder 12 is abutted on the erect portions 15k of the juxtaposing and mounting part 15 and the mounting faces 12f of the battery holder 12 are mounted on the erect face portions 15e of the juxtaposing and mounting part 15, whereby the wire mounting portion 12c is held above the board mounting area of the juxtaposing and mounting part 15. In this regard, the mounting faces 12f of the battery holder 12 and the erect face portions 15e of the juxtaposing and mounting part 15 are fixed to each other with screws or the like in the state of sandwiching the control board 2 (see FIGS. 3A and 3B).

Here, in the wire mounting portion 12c of the battery holder 12, as shown in FIG. 5A, the wire 3a has its one end mounted in the state of being connected to the electronic control circuit on the control board 2 and, as shown in FIG. 5B, has the other end connected to a connection portion of the battery pack 3 that can be removed from the battery holder 12, whereby the wire 3a can be electrically conducted to the BUB in the battery pack 3. In other words, in the wire mounting portion 12c of the battery holder 12, the wire 3a can be connected to the battery pack 3 removed from the battery holder 12 and, as shown in FIG. 5C, there is secured a space in which the wire 3a connected to the BUB in the battery pack 3 is received in the state where the battery pack 3 is received in the battery holder 12.

Next, the sealing front part 16 of the fixing frame 13 is formed integrally with the juxtaposing and mounting part 15 in such a way that the fixing frame 13 is shaped like a letter L as a whole. The sealing front part 16, as shown in FIGS. 2A to 2C, has fitted-in portions 16a, 16b, 16c in which the connectors 4 to 6 on the control board 2 are fitted from the juxtaposing and mounting part 15 side (reverse surface side of the sealing front part 16) and an opening portion 16d formed in such a way that the battery pack 3 is inserted into the battery holder 12.

Here, in the sealing front part 16, as described above, are formed screw holes that are arranged in such a way as to match the screw holes formed at four corners of the opening portion 11a of the housing 11 in the state where the battery holder 12 (and the battery fixture 14) and the control board 2 are fixed to the juxtaposing and mounting part 15 and where the juxtaposing and mounting part 15 is housed in the housing 11. As shown in FIG. 1, when the sealing front part 16 is screwed in the state in which the screw holes match the screw holes at the four corners of the opening 11a of the housing 11, the sealing front part 16 is fixed to the opening 11a of the housing 11.

Further, the opening portion 16d of the sealing front part 16 is formed in such a way that when the battery pack 3 is set in the battery holder 12, a cover part 33 of the battery pack 3 is fitted in from an obverse side of the sealing front part 16.

Figure 6A:
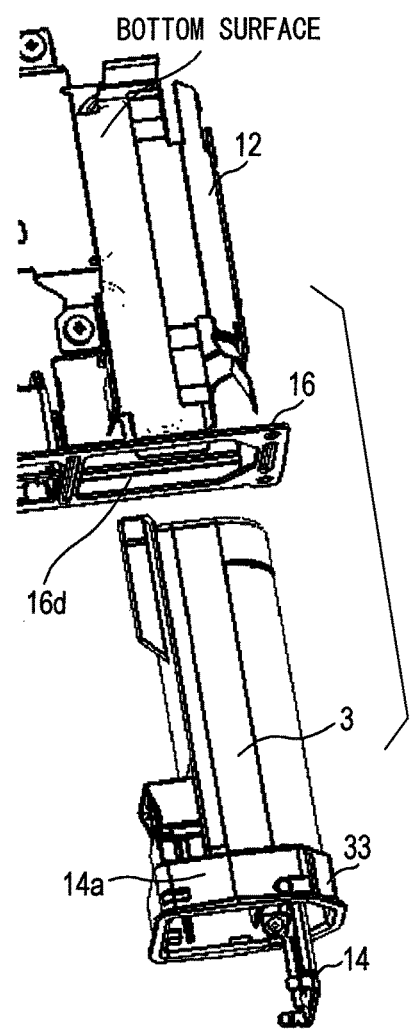
FIG. 6A is a perspective view to show an example in which a battery pack is housed in a protective case in the embodiment.
Figure 6B:
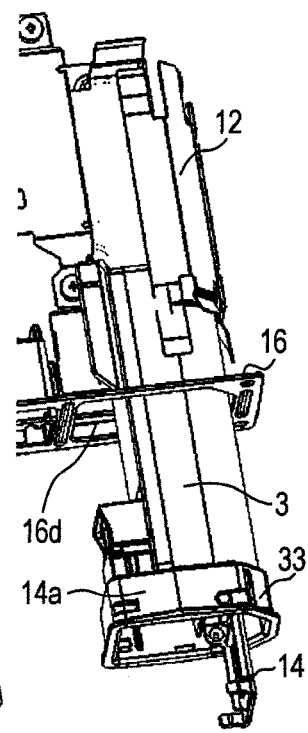
FIG. 6B is a perspective view to show an example in which the battery pack is housed in the protective case in the embodiment.
Figure 6C:
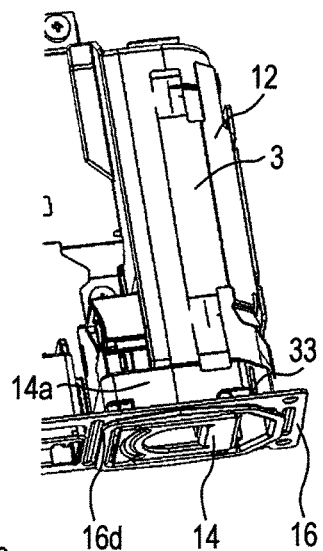
FIG. 6C is a perspective view to show an example in which the battery pack is housed in the protective case in the embodiment.

Specifically, as shown in FIG. 6A, the battery holder 12 has a bottom surface along the longitudinal direction of the battery pack 3. On the other hand, when the battery fixture 14 is fitted on the cover part 33 of the battery pack 3, the battery fixture 14 is fixed to the cover part 33 of the battery pack 3. Here, as shown in FIG. 6B, when the main body of the battery pack 3 is inserted into the battery holder 12 and is pushed in to the inner back side of the battery holder 12, as shown in FIG. 6C, a side peripheral face 14a connected to the cover part 33 of the battery pack 3 is fitted in the opening portion 16d of the sealing front part 16.

Figure 7A:
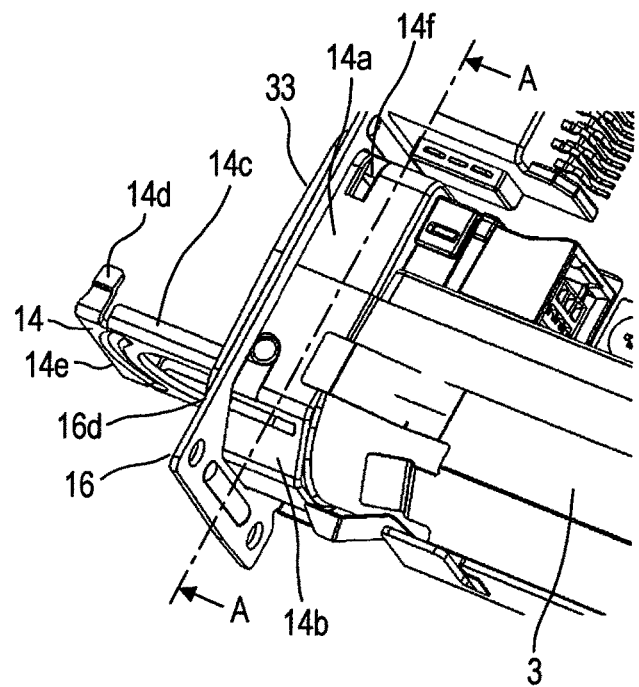
FIG. 7A is a perspective view to exemplify a construction of a battery fixture in the embodiment.

In more detail, as shown in FIG. 7A, the battery pack 3 is constructed of the side peripheral face 14a connected to the cover part 33 and a fixing frame portion 14b to fix the battery fixture 14 inside. On the other hand, the battery fixture 14 is constructed of: a journal end journaled by the fixing frame portion 14b of the battery pack 3; a turning door portion 14c turning around the journal end; and a stopper 14d provided on the turning door portion 14c and retained by the fixing frame portion 14b of the battery pack 3.

Figure 7B:
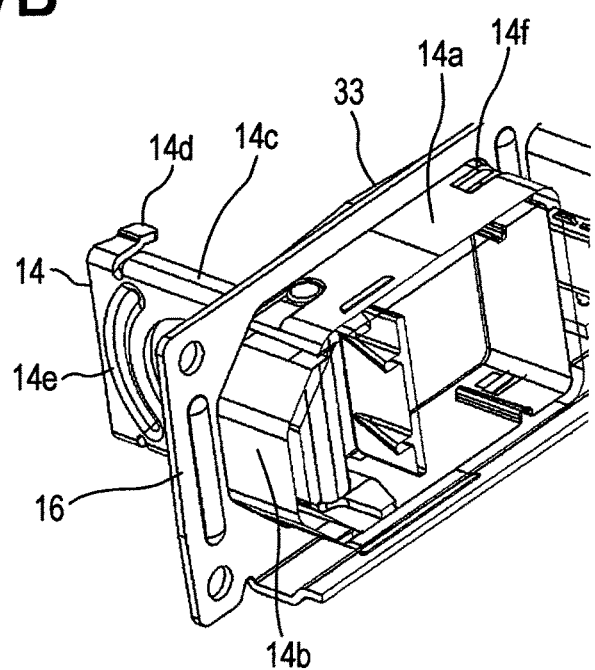
FIG. 7B is a perspective view having a section A-A in FIG. 7A to exemplify the construction of the battery fixture in the embodiment.

The fixing frame portion 14b of the battery pack 3, as shown in FIG. 7B, has its inner peripheral wall face worked in a shape to be fitted in the main body of the battery pack 3 and has its outer peripheral wall face worked in a shape in which the opening portion 16d of the sealing front part 16 is fitted in the side peripheral face 14a.

The turning door portion 14c of the battery fixture 14, as shown in FIGS. 8A and 8B, is journaled at upper and lower positions shifted from its center to one end in the fixing frame portion 14b of the battery pack 3. When a user opens a lever 14e fixed on a side opposite to the journal end, the user can pull out the battery pack 3 including the fixing frame portion 14b from the battery holder 12.

Further, when the user closes the lever 14e, the turning door portion 14c of the battery fixture 14 is fixed to the opening portion 16d of the sealing front part 16. Specifically, as shown in FIGS. 7A and 7B, the fixing frame portion 14b of the battery pack 3 has a fitting aperture 14f formed therein, the fitting aperture 14f having the stopper 14d fitted therein on the rear surface side of the opening portion 16d of the sealing front part 16, and when the stopper 14d of the battery fixture 14, which is protruded in such a way as to be able to slide toward the fitting aperture 14f at the upper and lower positions corresponding to the lever 14e in the turning door portion 14c of the battery fixture 14, is fitted in the fitting aperture 14f, the turning door portion 14c of the battery fixture 14 and the fixing frame portion 14b of the battery pack 3 are coupled to each other.

Further, the battery fixture 14 has a lock mechanism 14g to couple the fixing frame portion 14b of the battery pack 3 to the sealing front part 16 in the state where the side peripheral face 14a of the fixing frame portion 14b of the battery pack 3 is fitted in the opening portion 16d of the sealing front part 16. Specifically, as shown in FIGS. 5A to 5C, the lock mechanism 14g is provided on the upper surface of the fixing frame portion 14b (side peripheral face 14a) of the battery pack 3 and is constructed of: a turning member 14h turning around the journal end of the fixing frame portion 14b of the battery pack 3 above the turning door portion 14c; a claw portion 14i provided at a tip portion of the turning member 14h; and a stepped portion 14j provided at a position corresponding to the claw portion 14i on the upper surface of the fixing frame portion 14b (side peripheral face 14a) of the battery pack 3.

The lock mechanism 14g has a protruding portion at the tip of the claw portion 14i, and when the user turns the turning member 14h toward the opening portion 16 of the sealing front part 16 in the state where the side peripheral face 14a of the fixing frame portion 14b of the battery pack 3 is fitted in the opening portion 16d of the sealing front part 16, the claw portion 14i of the turning member 14h climbs up the stepped portion 14j of the fixing frame portion 14b of the battery pack 3. At this time, the protruding portion of the claw portion 14i is retained by the rear surface of the opening portion 16d of the sealing front part 16, whereby the fixing frame portion 14b and the sealing front part 16 are coupled to each other.

The construction of the back side holding portion 11b of the housing 11 and the tip portion 23 of the fixing frame 13 (juxtaposing and mounting part 15) will be described. The housing 11, as shown in FIG. 9A, is so constructed as to have one or a plurality of (three, in the present embodiment) back side holding portions 11b to hold the tip portion 23 of the juxtaposing and mounting part 15 of the fixing frame 13 on the inner back side of the housing 11 opposite to its opening portion 11a.

The back side holding portion 11b, as shown in FIG. 10A, is formed at a position separated by a distance (size) matching the shape of the tip protruding portion 15d of the fixing frame 13, which will be described later, from an inner bottom surface of the housing 11 in a face on the inner back side (inner back face) of the housing 11, and is constructed of: a protruding portion 11c protruding nearly parallel to the inner bottom surface of the housing 11 toward the opening portion of the housing 11; and a guide portion 11d to guide the tip protruding portion 15d of the fixing frame 13, which will be described later, to a portion abutting on the inner back face of the housing 11 in the protruding portion 11c.

On the other hand, as shown in FIG. 9A, in the juxtaposing and mounting part 15 of the fixing frame 13, the tip portion 23 on the side in which the juxtaposing and mounting part 15 is inserted into housing 11 is formed in a curved shape in such a way that the tip portion 23 is biased from above by the lower surface of the protruding portion 11c and is biased from below by the inner bottom surface of the housing 11 on the inner back side of the housing 11.

Specifically, the tip portion 23 of the fixing frame 13 is constructed of: a tip protruding portion 15d biased from above by the lower surface of the protruding portion 11c; a bottom surface portion 15c biased from below by the inner bottom surface of the housing 11; and a flange 23a to sandwich the protruding portion 11c together with the tip protruding portion 15d in the state where the control board 2 is mounted.

Of these portions, the bottom surface portion 15c of the fixing frame 13, as described by the use of FIG. 2A, is a portion other than the plurality of bottom surface protruding portions 15a formed by embossing the rear surface by drawing and the plurality of bottom surface opening portions 15b, of the bottom surface of the main portion of the fixing frame 13, and is so constructed as to abut on the inner bottom surface of the housing 11.

The tip protruding portion 15d, as shown in FIG. 2A, in the juxtaposing and mounting part 15 of the fixing frame 13, is formed by one or a plurality of numbers (three in the present embodiment) in an end portion positioned on the side opposite to the sealing front part 16 and is constructed so as to have a plane face portion formed at a higher position than the bottom surface portion 15c of the fixing frame 13 and so as to have a tip portion of the plane face portion bent obliquely downward.

The flange 23a, like the plurality of erect face portions 15e described above, is a portion on which the plate surface of the control board 2 is mounted so as to fix the control board 2 and, as shown in FIG. 9A, is erected from a position on a side closer to the sealing front part 16 than the bottom surface portion 15c and is bent so as to abut on the upper surface of the protruding portion 11c of the housing 11 in the tip portion 23 of the main body of the fixing frame 13.

In the tip portion 23 of the fixing frame 13, a distance (size) between the lower surface of the flange 23a and the upper surface (plane face portion) of the tip protruding portion 15d is designed in a size equal to or a little smaller than the thickness of the protruding portion 11c of the housing 11. In this way, in the tip portion 23 of the main body of the fixing frame 13, the protruding portion 11c of the housing 11 can be sandwiched by the lower surface of the flange 23a and the upper surface (plane face portion) of the tip protruding portion 15d.

Further, in the tip portion 23 of the fixing frame 13, a distance (size) between the upper surface (plane face portion) of the tip protruding portion 15d and the lower surface of the bottom surface portion 15c is designed in a size equal to or a little larger than a distance (size) between the lower surface of the protruding portion 11c of the housing 11 and an inner bottom surface of the housing 11 (in more detail, the upper surface of the guide portion 11d). In this way, in the tip portion 23 of the main body of the fixing frame 13, the upper surface of the tip protruding portion 15d is biased from above by the lower surface of the protruding portion 11c of the housing 11 and the lower surface of the bottom surface portion 15c is biased from below by the inner bottom surface of the housing 11 (in more detail, the upper surface of the guide portion 11d).

On the other hand, in the inner back side holding portion 11b of the housing 11, as shown in FIG. 10A, the tip portion of the protruding portion 11c has a curved surface shape to guide the tip protruding portion 15d of the fixing frame 13 to the inner back side of the housing 11. Further, the guide portion 11d has a slope formed thereon, the slope guiding the bottom surface portion 15c of the fixing frame 13 to the inner back side of the housing 11.

In more detail, as shown in FIGS. 10B, 10C, and 10D, when the tip portion 23 of the fixing frame 13 is inserted to the inner back side of the housing 11, the bottom surface portion 15c of the fixing frame 13 is gradually pushed upward by the slope of the guide portion 11d in the state where the tip protruding portion 15d of the fixing frame 13 is guided to the inner back side of the housing 11 by the tip portion (curved face portion) of the protruding portion 11c (FIG. 10B FIG. 10C). Then, when the bottom surface portion 15c of the fixing frame 13 finally climbs over the slope and up to the upper surface of the guide portion 11d, the tip protruding portion 15d of the fixing frame 13 is strongly pressed from the upper side by the protruding portion 11c of the housing 11 (FIG. 10C→FIG. 10D).

The effect of the present embodiment will be described. As described above, the electronic control unit 1 of the present embodiment includes the fixing frame 13 and the housing 11. The fixing frame 3 has the juxtaposing and mounting part 15 on which the control board 2 and the battery pack 3 are mounted in the state of being adjacent to each other at the boundary along the longitudinal direction of the battery pack 3. The juxtaposing and mounting part 15 has the control board 2 and the battery pack 3 fixed thereto. The housing 11 houses the control board 2 and the battery pack 3. The housing 11 has: the opening portion 11a into which the juxtaposing and mounting part 15 of the fixing frame 13 is inserted; and the back side holding portion 11b that holds the juxtaposing and mounting part 15 on the inner back side of the housing 11 opposite to the opening portion 11a. The housing 11 fixes the fixing frame 13 to the opening portion 11a.

Further, in the electronic control unit 1, the back side holding portion 11b of the housing 11 has the protruding portion 11c that protrudes toward the opening portion 11a at the position separate from the bottom surface on the inner back side of the housing 11, and in the juxtaposing and mounting part 15 of the fixing frame 13, the tip portion 23 on the side in which the juxtaposing and mounting part 15 is inserted into housing 11 has the curved shape by which the tip portion 23 is biased from above by the lower surface of the protruding portion 11c and is biased from below by the inner bottom surface of the housing 11 on the inner back side of the housing 11.

For this reason, first, in the case where the fixing frame 13 is housed in the housing 11 in the state where the control board 2 and the battery pack 3 are fixed to the juxtaposing and mounting part 15, the fixing frame 13 is held by the back side holding portion 11b of the housing 11 and the fixing frame 13 is fixed to the opening portion 11a of the housing 11, whereby the fixing frame 13 can be held from both sides opposite to each other in the housing 11 and hence the supporting strength of the control board 2 in the housing 11 can be held.

Next, the fixing frame 13 has the control board 2 and the battery pack 3 fixed thereto adjacently to each other in the state of being arranged side by side. Hence, for example, the housing 11 can be formed in a rectangular shape, which hence eliminates the need for providing a dead space around the housing 11. Further, this can eliminates the need for providing a wall to partition a space in which the control board 2 is arranged and a space in which the battery pack 3 is arranged.

In the electronic control unit 1, on the basis of this construction, the tip portion 23 of the juxtaposing and mounting part 15 of the fixing frame 13 is formed in the curved shape by which the tip portion 23 is biased by the lower face of the protruding portion 11c and by the inner bottom surface of the housing 11 in the back side holding portion 11b of the housing 11. Hence, when the tip portion 23 of the juxtaposing and mounting part 15 of the fixing frame 13 is held by the back side holding portion 11b of the housing 11, the tip portion 23 can be designed in such a way as to be able to absorb a part size error of tip portion 23 and the protruding portion 11c in the back side holding portion 11b of the housing 11. In this way, the tip portion 23 of the juxtaposing and mounting part 15 of the fixing frame 13 can be suitably held by the back side holding portion 11b of the housing 11.

Further, as shown in FIG. 9B, even in the case where an external force to a bottom surface side (in a R1 direction) of the housing 11 is applied to the tip protruding portion 15d of the fixing frame 13, by a reaction force that the bottom surface portion 15c of the fixing frame 13 receives from the bottom surface of the housing 11 (in a R2 direction), the fixing frame 13 can be restrained from being bent.

Hence, according to the electronic control unit 1, in the construction that secures the supporting strength of the control board 2 in the housing 11 and avoids a layout relating to setting the parts from being complicated and can contribute to miniaturizing the device, by suitably restraining the fixing frame 13 from being bent, the control board 2 fixed to the fixing frame 13 can be suitably restrained from being bent.

Further, the juxtaposing and mounting part 15 of the fixing frame 13 has the flange 23a that sandwiches the protruding portion 11c in the back side holding portion 11b of the housing 11 together with its tip protruding portion 15d in the state where the control board 2 is mounted on the juxtaposing and mounting part 15. For this reason, even in the case where the external force to the bottom surface side of the housing 11 (in the R1 direction) is applied to the flange 23a, by the reaction force that the bottom surface portion 15c of the fixing frame 13 receives from the bottom surface of the housing 11 (in the R2 direction), the fixing frame 13 can be restrained from being bent. Hence, when the tip protruding portion 15d of the fixing frame 13 sandwiches the protruding portion 11c in the back side holding portion 11b of the housing 11, the fixing frame 13 in the housing 11 can be strongly held and the control board 2 can be suitably restrained from being bent.

Still further, in the juxtaposing and mounting part 15 of the fixing frame 13, the bottom surface portion 15c thereof is formed by drawing the main body of the fixing frame 13. For this reason, in the tip portion 23 of the juxtaposing and mounting part 15 of the fixing frame 13, without adding and joining a new member, the tip portion 23 can be provided with the bottom surface portion 15c of the fixing frame 13 that is to be biased from below by the inner bottom surface of the housing 11, which hence can reduce the weight of the fixing frame 13 and can facilitate the manufacture of the fixing frame 13.

Still further, the tip portion of the protruding portion 11c in the back side holding portion 11b of the housing 11 has a curved surface shape to guide the tip protruding portion 15d of the fixing frame 13 to the inner back side of the housing 11. For this reason, for example, even if a distance (size) from the upper surface of the tip protruding portion 15d to the lower surface of the bottom surface portion 15c in the fixing frame 13 is larger than a distance (size) from the lower surface of the protruding portion 11c to the inner bottom surface in the back side holding portion 11b of the housing 11, for example, by as large a magnitude as a part size error, the tip protruding portion 15d of the fixing frame 13 can be easily inserted to the inner back side of the housing 11. Hence, the tip portion 23 of the fixing frame 13 can be more strongly biased by the back side holding portion 11b of the housing 11. In this way, the tip portion 23 of the fixing frame 13 can be suitably held by the back side holding portion 11b of the housing 11.

Still further, the back side holding portion 11b of the housing 11 has the guide portion 11d on which the slope is formed, the slope gradually pushing up the bottom surface portion 15c of the fixing frame 13 when the tip protruding portion 15d of the fixing frame 13 is guided to the inner back side of the housing 11 by the tip portion of the protruding portion 11c. For this reason, the tip portion 23 of the fixing frame 13 can be more strongly biased by the back side holding portion 11b of the housing 11. Hence, the tip portion 23 of the fixing frame 13 can be more suitably held by the back side holding portion 11b of the housing 11.

Modified examples of the embodiment will be described. Up to this point, the embodiment has been described. However, the present disclosure is not limited to the embodiment described above but can be performed in various modes within a range not departing from the gist of the present disclosure.

For example, in the electronic control unit 1 of the embodiment described above, the fixing frame 13 is formed in the shape of a letter L but is not limited to this shape. If the fixing frame 13 has a construction having the juxtaposing and mounting part 15 and the sealing front part 16, the fixing frame 13 may be formed in any shape.

Further, in the electronic control unit 1 of the embodiment described above has been described an example in which the sealing front part 16 of the fixing frame 13 is fixed to the opening portion 11a of the housing 11 with screws. However, the present disclosure is not limited to this example but, for example, the sealing front part 16 of the fixing frame 13 may be joined to the opening portion 11a of the housing 11 with snap fit.

Still further, in the electronic control unit 1 of the embodiment has been described an example in which the control board 2 is fixed to the juxtaposing and mounting part 15 of the fixing frame 13 with screws. However, the present disclosure is not limited to this example but, for example, the control board 2 may be joined to the juxtaposing and mounting part 15 of the fixing frame 13 with snap fit.

Still further, in the electronic control unit 1 of the embodiment described above, a construction in which the control board 2 is mounted on (fixed to) the flange 23a has been described by way of example. However, the present disclosure is not limited to this construction but the control board 2 may be mounted on (fixed to) any place in the board mounting area in the fixing frame 13.

In this regard, in the embodiment described above has been described an example in which the protective case 10 constructs the eCall unit as the electronic control unit 1. However, the present disclosure is not limited to this example but the protective case 10 can be applied as a case to construct various electronic control units.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control unit comprising:
    a plate-shaped control board that includes an electronic control circuit mounted with electronic parts;
    a long pillar-shaped battery pack that receives a backup battery capable of constantly supplying electric power to the electronic control circuit;
    a fixing frame that includes a juxtaposing and mounting part on which the control board and the battery pack are mounted in a state of being adjacent to each other with a boundary line along a longitudinal direction of the battery pack therebetween, wherein the control board and the battery pack are fixed to the juxtaposing and mounting part; and
    a housing that includes an opening portion and a back side holding portion to accommodate the control board and the battery pack, wherein:
    the juxtaposing and mounting part of the fixing frame is inserted into the opening portion;
    the fixing frame is fixed to the opening portion;
    the back side holding portion holds the juxtaposing and mounting part at an inner back side of the housing opposed to the opening portion;
    the back side holding portion of the housing includes a protruding portion protruding toward the opening portion at a position away from a bottom surface of the housing on the inner back side of the housing;
    the juxtaposing and mounting part of the fixing frame includes a tip portion in a direction of the insertion of the juxtaposing and mounting part into the housing; and
    the tip portion has a curved shape that is urged from its upper side by a lower surface of the protruding portion and that is urged from its lower side by the bottom surface of the housing on the inner back side of the housing.

2. The electronic control unit according to claim 1, wherein:
    the tip portion of the juxtaposing and mounting part of the fixing frame in the direction of the insertion of the juxtaposing and mounting part into the housing includes a tip protruding portion that is urged from its upper side by the lower surface of the protruding portion; and
    the juxtaposing and mounting part includes a flange that clamps the protruding portion together with the tip protruding portion with the control board mounted on the flange.

3. The electronic control unit according to claim 1, wherein:
    the tip portion of the juxtaposing and mounting part of the fixing frame in the direction of the insertion of the juxtaposing and mounting part into the housing includes a bottom surface portion that is urged from its lower side by the bottom surface of the housing; and the bottom surface portion is formed by drawing a main body of the fixing frame.

4. The electronic control unit according to claim 1, wherein:

the tip portion of the juxtaposing and mounting part of the fixing frame in the direction of the insertion of the juxtaposing and mounting part into the housing includes a tip protruding portion that is urged from its upper side by the lower surface of the protruding portion; and a tip portion of the protruding portion has a curved surface shape for guiding the tip protruding portion to the inner back side of the housing.

5. The electronic control unit according to claim 4, wherein:

the tip portion of the juxtaposing and mounting part of the fixing frame in the direction of the insertion of the juxtaposing and mounting part into the housing includes a bottom surface portion that is urged from its lower side by the bottom surface of the housing; and the back side holding portion of the housing includes a guide portion having a slope for gradually pushing up the bottom surface portion when the tip protruding portion of the fixing frame is guided to the inner back side of the housing by the tip portion of the protruding portion.

6. A protective case comprising:

a fixing frame that includes a juxtaposing and mounting part on which a plate-shaped control board and a long pillar-shaped battery pack are mounted in a state of being adjacent to each other with a boundary line along a longitudinal direction of the battery pack therebetween, wherein:

the control board includes an electronic control circuit mounted with electronic parts;

the battery pack receives a backup battery capable of constantly supplying electric power to the electronic control circuit; and the control board and the battery pack are fixed to the juxtaposing and mounting part; and a housing that includes an opening portion and a back side holding portion to accommodate the control board and the battery pack, wherein:

the juxtaposing and mounting part of the fixing frame is inserted into the opening portion;

the fixing frame is fixed to the opening portion;

the back side holding portion holds the juxtaposing and mounting part at an inner back side of the housing opposed to the opening portion;

the back side holding portion of the housing includes a protruding portion protruding toward the opening portion at a position away from a bottom surface of the housing on the inner back side of the housing;

the juxtaposing and mounting part of the fixing frame includes a tip portion in a direction of the insertion of the juxtaposing and mounting part into the housing; and the tip portion has a curved shape that is urged from its upper side by a lower surface of the protruding portion and that is urged from its lower side by the bottom surface of the housing on the inner back side of the housing.

* * * * *